(12) United States Patent
Casper

(10) Patent No.: US 7,408,828 B1
(45) Date of Patent: *Aug. 5, 2008

(54) SYSTEM AND METHOD FOR REDUCING POWER CONSUMPTION DURING EXTENDED REFRESH PERIODS OF DYNAMIC RANDOM ACCESS MEMORY DEVICES

(75) Inventor: Stephen L. Casper, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 38 days.

This patent is subject to a terminal disclaimer.

(21) Appl. No.: 11/430,379

(22) Filed: May 8, 2006

Related U.S. Application Data

(63) Continuation of application No. 11/003,547, filed on Dec. 3, 2004, now Pat. No. 7,082,073.

(51) Int. Cl.
*G11C 7/00* (2006.01)
(52) U.S. Cl. ............... 365/222; 365/203; 365/149
(58) Field of Classification Search ........... 365/222, 365/203, 149, 189.07, 189.09
See application file for complete search history.

(56) References Cited

U.S. PATENT DOCUMENTS

| 5,262,998 | A | | 11/1993 | Mnich et al. ............. 365/222 |
| 5,563,837 | A | * | 10/1996 | Noguchi ................. 365/222 |
| 5,886,932 | A | | 3/1999 | Choi ................. 365/189.09 |
| 5,956,281 | A | | 9/1999 | Nakai et al. ............. 365/222 |
| 6,034,916 | A | | 3/2000 | Lee ....................... 365/233 |
| 6,064,625 | A | | 5/2000 | Tomita .................. 365/233 |
| 6,081,477 | A | | 6/2000 | Li ........................ 365/233 |
| 6,097,658 | A | * | 8/2000 | Satoh et al. ............. 365/222 |
| 6,188,638 | B1 | | 2/2001 | Kuhne .................... 365/233 |
| 6,201,756 | B1 | | 3/2001 | Lee ..................... 365/230.04 |
| 6,215,710 | B1 | | 4/2001 | Han et al. ................ 365/193 |
| 6,229,757 | B1 | | 5/2001 | Nagata et al. ............ 365/233 |
| 6,288,971 | B1 | | 9/2001 | Kim ...................... 365/233 |
| 6,292,410 | B1 | | 9/2001 | Yi et al. ................. 365/193 |
| 6,337,824 | B1 | * | 1/2002 | Kono et al. .............. 365/207 |
| 6,407,963 | B1 | | 6/2002 | Sonoda et al. .......... 365/233.5 |
| 6,466,491 | B2 | | 10/2002 | Yanagawa ............... 365/194 |
| 6,529,993 | B1 | | 3/2003 | Rogers et al. ........... 711/105 |
| 6,728,162 | B2 | | 4/2004 | Lee et al. ................ 365/233 |
| 6,760,261 | B2 | | 7/2004 | Partsch et al. ......... 365/189.05 |
| 6,760,856 | B1 | | 7/2004 | Borkenhagen et al. ..... 713/401 |
| 6,771,552 | B2 | | 8/2004 | Fujisawa ................ 365/221 |
| 6,775,190 | B2 | | 8/2004 | Setogawa ............... 365/193 |

(Continued)

*Primary Examiner*—Anh Phung
*Assistant Examiner*—Dang Nguyen
(74) *Attorney, Agent, or Firm*—Dorsey & Whitney LLP

(57) ABSTRACT

A dynamic random access memory ("DRAM") device is operable in either a normal refresh mode or a static refresh mode, such as a self-refresh mode. A cell plate voltage selector couples a voltage of one-half the supply voltage to the cell plate of a DRAM array in a normal refresh mode and in the static refresh mode when memory cells are being refreshed. In between refresh bursts in the static refresh mode, the cell plate voltage selector couples a reduced voltage to the cell plate. This reduces the voltage reduces the voltage across diode junctions formed between the source/drain of respective access transistor and the substrate. The reduced voltage reduces the discharge current flowing from memory cells capacitors, thereby allowing a reduction in the required refresh rate and a consequential reduction in power consumption.

13 Claims, 6 Drawing Sheets

U.S. PATENT DOCUMENTS

| | | | |
|---|---|---|---|
| 6,819,599 B2 | 11/2004 | Schaefer | 365/189.07 |
| 6,922,367 B2 | 7/2005 | Morzano et al. | 365/193 |
| 6,934,211 B2 | 8/2005 | Hazama et al. | 365/222 |
| 7,031,205 B2 | 4/2006 | Han et al. | 365/193 |
| 7,280,417 B2 | 10/2007 | Choi et al. | 365/193 |
| 2005/0105372 A1* | 5/2005 | Kanda | 365/230.06 |
| 2007/0028027 A1 | 2/2007 | Janzen et al. | 711/5 |
| 2007/0053226 A1* | 3/2007 | Lee et al. | 365/189.09 |
| 2007/0058459 A1 | 3/2007 | Kitamura | 365/193 |

* cited by examiner

SYSTEM AND METHOD FOR REDUCING POWER CONSUMPTION DURING EXTENDED REFRESH PERIODS OF DYNAMIC RANDOM ACCESS MEMORY DEVICES

CROSS-REFERENCE TO RELATED APPLICATION

This application is a continuation of pending U.S. patent application Ser. No. 11/003,547, filed Dec. 3, 2004.

TECHNICAL FIELD

This invention relates to dynamic random access memory devices, and, more particularly, to a system and method for reducing memory cell leakage during extended refresh periods to allow the time between refreshes to be increase, thereby reducing power consumption.

BACKGROUND OF THE INVENTION

Many battery-powered portable electronic devices, such as laptop computers, Portable Digital Assistants, cell phones, and the like, require memory devices that provide large storage capacity and low power consumption. To reduce the power consumption and thereby extend the operating time of such devices between recharges, the devices typically operate in a low-power mode when the device is not being used. In the low-power mode, a supply voltage or voltages applied to electronic components such as a microprocessor, associated control chips, and memory devices are typically reduced to lower the power consumption of the components, as will be appreciated by those skilled in the art. Although the supply voltages are varied to reduce power consumption in the low-power mode, data stored in the electronic components such as the memory devices must be retained.

A large storage capacity is typically desired in these devices to maximize the amount of available storage. For this reasons, it is usually desirable to utilize dynamic random access memory ("DRAM") devices, which have a relatively large storage capacity, over other types of memories such as static random access memory ("SRAM") devices and non-volatile memories such as FLASH memory devices. However, DRAM devices have the disadvantage that their memory cells must be continually refreshed because of the means by which they store data. Refreshing DRAM memory cells tends to consume power at a substantial rate. As is well-known in the art, DRAM memory cells each consists of a capacitor that is charged to one of two voltages to store a bit of data. Charge leaks from the capacitor by various means. It is for this reason that DRAM memory cells must be refreshed by recharging them to the original voltage. Refresh is typically performed by essentially reading data bits from the memory cells in each row of a memory cell array and then writing those same data bits back to the same cells in the row. This refresh is generally performed on a row-by-row basis at a rate needed to keep charge stored in the memory cells from leaking excessively between refreshes. Each time a row of memory cells is refreshed, a pair of digit lines for each memory cell are switched to complementary voltages and then equilibrated, which consumes a significant amount power. As the number of columns in the memory cell array increases with increasing memory capacity, the power consumed in actuating each row increases accordingly.

The amount of power consumed by refresh also depends on which of several refresh modes is active. A Self Refresh mode is normally active during periods when data are not being read from or written to the DRAM device. Since portable electronic devices are often inactive for substantial periods of time, the amount of power consumed during Self Refresh can be an important factor in determining how long the electronic device can be used between battery charges.

The amount of power consumed by refreshing DRAM devices in any refresh mode is proportional to the rate at which it is necessary to perform refreshes. If the required refresh rate for a DRAM device could be reduced, so also could the refresh power consumption. The required refresh rate is determined by the rate at which charge leaks from the memory cell capacitors. Therefore, some attempts to increase the time required between refreshes have focused on adjusting the rate of refresh as a function of the rate of charge leakage from memory cell capacitors. For example, since the rate at which charge leaks from memory cells capacitors is a function of temperature, some power saving techniques adjust the refresh rate as a function of temperature. As a result, refreshes do not occur more frequently than necessary.

Other attempts to increase the time required between refreshes have focused on reducing the amount of charge leakage from memory cell capacitors. With reference to FIG. 1, a portion of a typical DRAM array 100 includes a plurality of memory cells 110, each of which is coupled to a word line WL and a digit line DL. The memory cells 110 in the array 100 are arranged in rows and columns, with a word line being provided for each row of memory cells 100. The word lines WL are coupled to and actuated by a row decoder 112 responsive to a row address A0-AX. As shown in FIG. 1, the DRAM array 100 has a folded digit line architecture so that complimentary digit lines DL and DL* are provided for each column of memory cells 110. In a memory array having an open digit line architecture (not shown), a single digit line DL is included in the array for each column of memory cells 110. The other digit line is provided by an adjacent array. However, the following discussion of the problems with DRAM arrays and prior attempts to solve such problems is applicable to arrays having an open digit line architecture as well as arrays having a folded digit line architecture.

Regardless of whether the array has a folded digit line architecture or an open digit line architecture, each memory cell 110 includes a memory cell capacitor 114 coupled between a cell plate 116 and a storage node 118. The cell plate is normally common to all of the memory cells 110 in an array, and it is generally biased to a voltage of $V_{CC}/2$. An access transistor 120 is coupled between the storage node 118 and a digit line DL for the column containing the memory cell 110. The gate of the access transistor 120 is coupled to a word line WL for the row containing the memory cell 110. When a data bit is to be written to the memory cell 110, a voltage corresponding to the data bit, generally either Vcc or zero volts, is applied to the digit line DL to which the memory cell 110 is coupled, and the voltage applied to the word line WL is driven high to turn ON the access transistor 120. The access transistor then couples the digit line DL to the capacitor 114 to store the voltage of the digit line DL in the capacitor 114. For a read operation, the digit line DL is first equilibrated to an equilibration voltage, generally to $V_{CC}/2$, and the word line WL is then driven high to turn ON the access transistor 120. The access transistor 120 then couples the capacitor 114 to the digit line DL to slightly alter the voltage on the digit line DL above or below the equilibration voltage depending upon the voltage stored in the capacitor 114. An n-sense amplifier 130 and a p-sense amplifier 132 sense whether the voltage has increased or decreased responsive to applying an active low NSENSE* signal of normally zero volts to the n-sense amplifier 130 and applying an active high PSENSE signal of normally $V_{CC}$ to the p-sense amplifier 132. The NSENSE* signal and the PSENSE signal are supplied by control circuitry (not shown) in a DRAM. If a voltage increase was sensed, the p-sense amplifier 132 drives the digit line DL to $V_{CC}$, and, if a voltage decrease was sensed, the n-sense amplifier 130 drives the digit line DL to zero volts. The voltage applied to the digit line DL by the sense amplifiers 130, 132 then recharges the capacitor 114 to the voltage to which it was originally charged. A column decoder 136 couples one of the pairs of complimentary digit lines DL, DL* to complimentary input/output lines "IO, IO* responsive to a column address A0-AY.

The above-described memory read process of activating a word line WL and then sensing the digit line voltage of all memory cells 100 in the row for the active word line WL is what is done to refresh the memory cells 100. If the voltage on the capacitor 114 has been excessively discharged from Vcc or excessively charged from zero volts between refreshes, it can be impossible for the sense amplifiers 130, 132 to accurately read the voltage to which the memory cell capacitor 114 was charged. The result is an erroneous reading of the memory cell 100 known as a data retention error.

As is well known in the art, the charge placed on a memory cell capacitor 114 dissipates through a variety of paths. One discharge path is through the dielectric of the capacitor 114 itself. Another significant discharge path is through the access transistors 120 coupling the capacitors 114 to the digit lines DL when the transistors 120 are turned OFF. This leakage current is known as the "sub-threshold" leakage current of the transistors 120. Reducing the sub-threshold leakage current of the access transistors 120 allows the capacitor 114s to retain a voltage that is close enough to the voltage initially placed on the capacitors 114 for a data retention error to be avoided. Various approaches have been used to reduce the sub-threshold leakage of the access transistors 120 to allow memory cell capacitors 114 to retain charge for a longer period between refreshes. Some of these approaches rely on increasing the threshold voltage $V_T$ of the access transistor 120 by either biasing the word lines to a negative voltage when the word line is not active or by biasing the substrate to a less negative voltage.

Another path through with the charge placed on a memory cell capacitor 114 can dissipates is from the access transistor 120 to the substrate. With reference to FIG. 2, a typical memory cell access transistor 120 is in NMOS transistor for up in a P-type substrate 140 having a first n-doped source/drain region 142 and a second n-doped source/drain region 144. The first n-doped source/drain region 142 is coupled to a digit line DL, and the second n-doped source/drain region 144 is coupled to a memory cell capacitor 114. The access transistor 120 also includes a gate formed by a gate electrode 146 insulated from the substrate 140 by an oxide layer 148. The gate electrode 146 is coupled to a word line WL. The n-doped source/drain region 144 that is coupled to the memory cell capacitor and the p-doped substrate 140 together form a diode junction 150, which is schematically illustrated in FIG. 3 along with the access transistor 120 and the memory cell capacitor 114. The substrate 140 is biased to a voltage $V_{DD}$ that is typically negative, such as −0.5 V. As previously mentioned, the cell plate 116 is typically biased to $V_{CC}/2$, such as 1 V, as shown in FIG. 3. Therefore, when the memory cell capacitor 114 is charged to a voltage of $V_{CC}$, which in this example is 2 V, the diode junction 150 is back-biased with a voltage of 2.5 V. Unfortunately, even though the diode junction 150 is back-biased, a significant amount of charge leaks through the diode junction 150. This charge leakage limits the period of time that the memory cell capacitor 114 can retain its charge without being refreshed. As a result, the memory cell capacitor 114 must be frequently refreshed, thereby causing a DRAM device containing the memory cell capacitor 114 to consume substantial power.

There is therefore a need for a technique to reduce the charge leakage through the diode junction 150 so that the time between required refreshes can be increased, thereby allowing DRAM devices to consume less power.

SUMMARY OF THE INVENTION

A system and method of refreshing memory cells in an array allows refresh to occur in a normal refresh mode or in a static refresh mode, such as a self-refresh mode. In the normal refresh mode, a cell plate for the array is biased to a first voltage, such as one-half a supply voltage. The cell plate is also biased to the first voltage in the static refresh mode when the memory cells are being refreshed, which preferably occurs in a burst manner. However, the cell plate is biased to a second voltage in the static refresh mode when the memory cells are not being refreshed. This second voltage reduces the voltage between the source/drain of access transistors for the memory cells and the substrate, thereby reducing leakage current from memory cell capacitors. As a result, a reduced refresh rate can be achieved.

DETAILED DESCRIPTION

Figure 1:
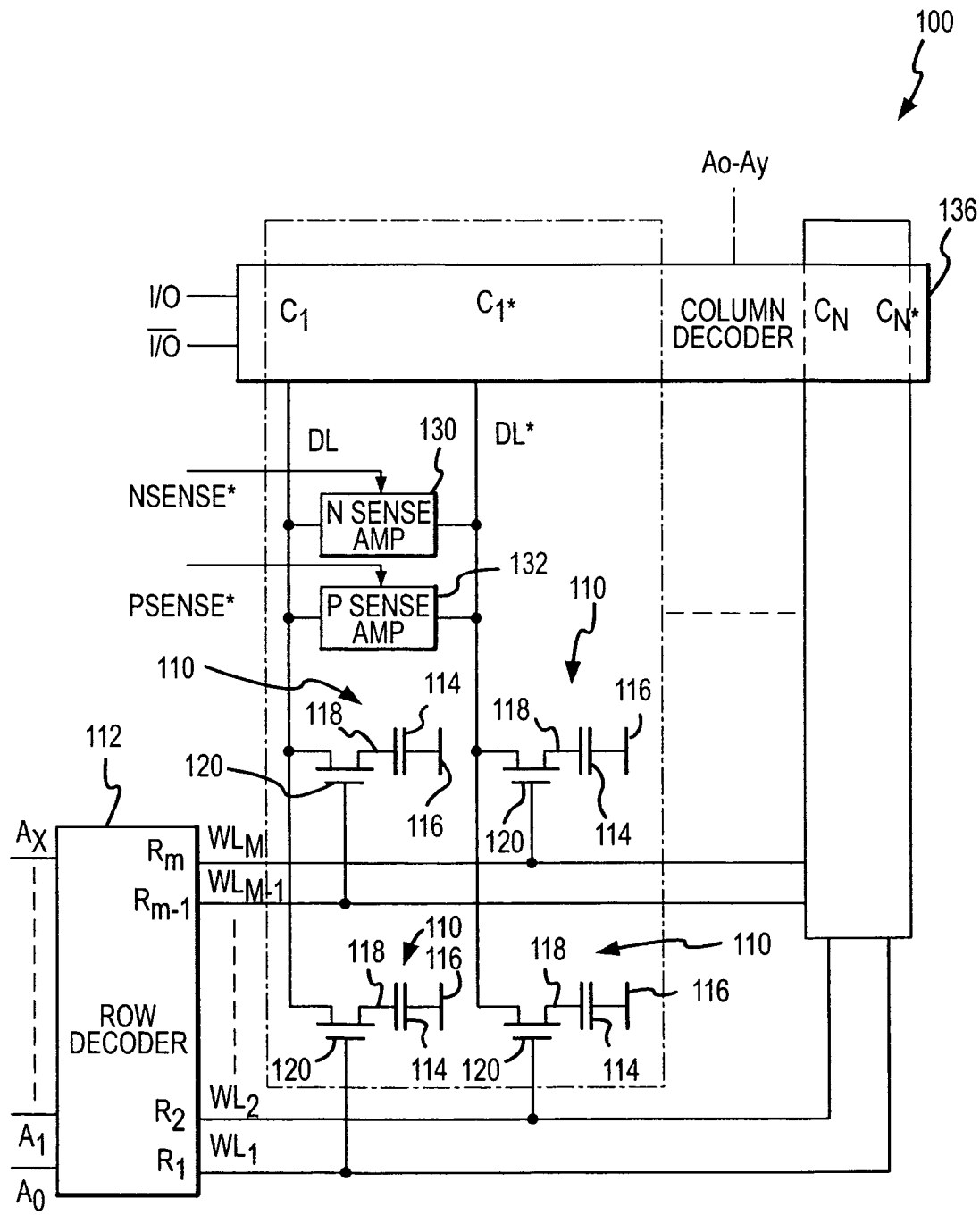
FIG. 1 is a schematic diagram showing a portion of a typical DRAM memory cell array.
Figure 2:
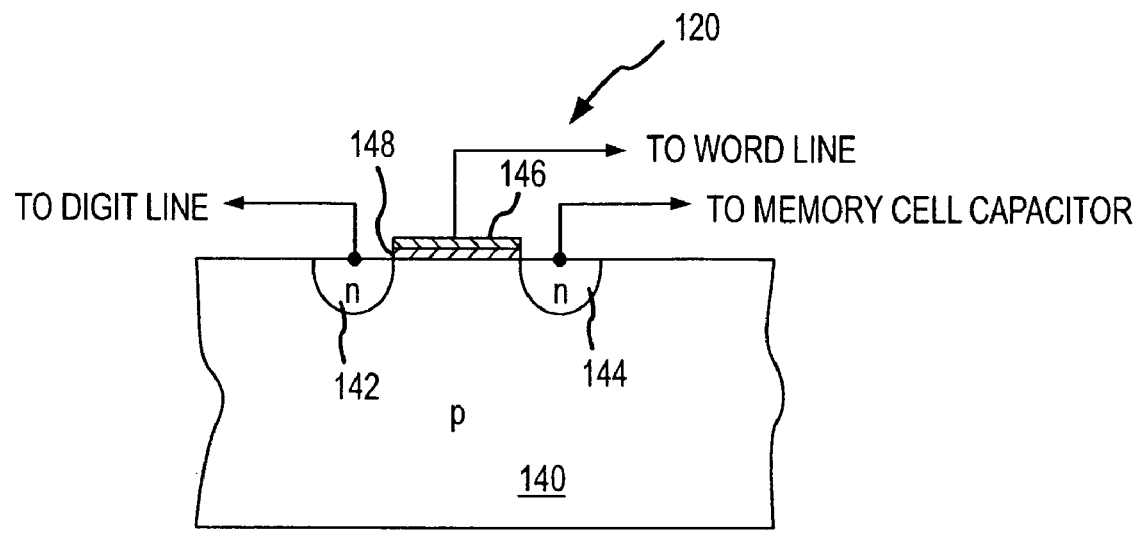
FIG. 2 is a cross-sectional view filed a typical access transistor used in the memory cell array of FIG. 1.
Figure 3:
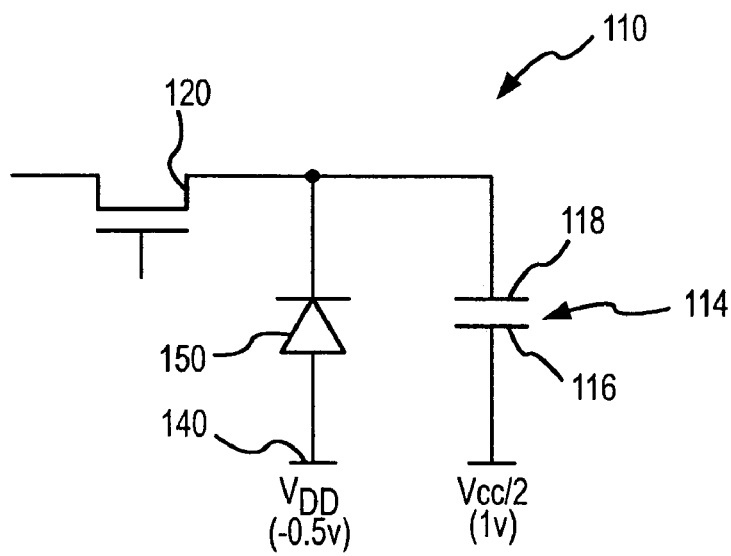
FIG. 3 is a schematic diagram showing a diode junction formed by the access transistor of FIG. 2.
Figure 4:
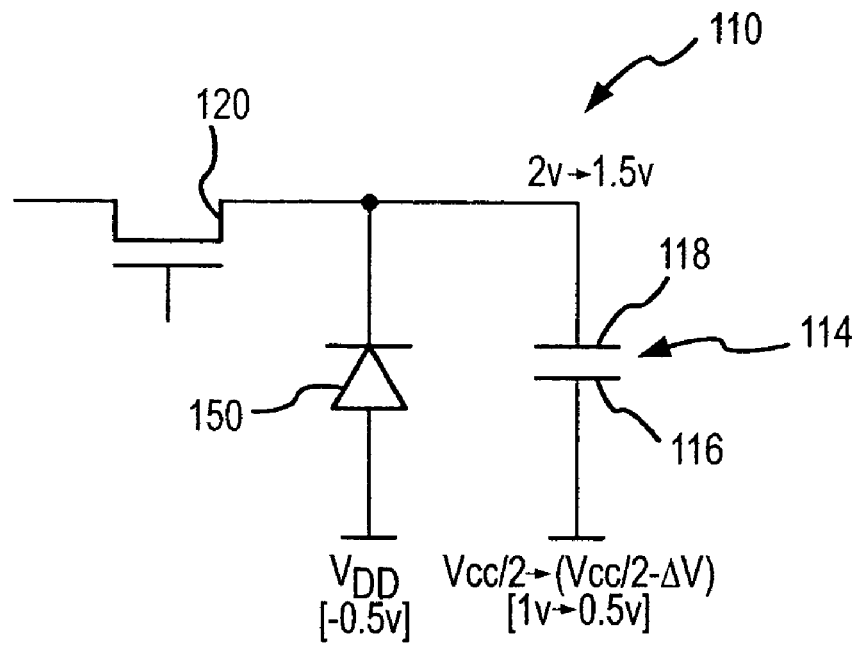
FIG. 4 is a schematic diagram showing memory cell of FIG. 3 in which the memory cell capacitor has been charged to Vcc.

The principal of the operation of one embodiment of the invention is exemplified by the memory cell 110 shown in FIG. 4, which contains the access transistor 120, the memory cell capacitor 114 and the diode junction 150. As shown in FIG. 4, the memory cell capacitor 114 is initially charged to Vcc, which is, in this example, 2 V. As previously explained, this condition places 2.5 V across the diode junction 150 is it results in substantial leakage from the memory cell capacitor 114. According to one embodiment of the invention, when a DRAM containing the memory cell 110 shown in FIG. 4 is to operate in a self-refresh mode, the DRAM reduces the bias voltage on the cell plate 116 from $V_{CC}/2$ to a lesser voltage $V_{CC}/2-\Delta V$, which, in this example, is a change in voltage from 1V to 0.5V. When the voltage on the cell plate 116 is reduced by $\Delta V$, the voltage on the other plate 118 of the memory cell capacitor 114 is also reduced by ΔV, which, in this example, reduces the voltage to 1.5V. The voltage across the diode junction 150 is therefore reduced from 2.5 V to 2.0 V. Even this relatively small reduction in the voltage across the diode junction 150 can significantly reduce the rate at which charge leaks from the memory cell capacitor 114, thereby allowing a reduction in the required refresh rate.

It requires a significant amount of powers to reduce the cell plate voltage from $V_{CC}$ to $V_{CC}-\Delta V$, so it will generally be advantageous to do so relatively infrequently. For this reason, the cell plate voltage is preferably reduced only during self-refresh and any other static refresh mode in which data are not been read from or written to the DRAM device for a considerable period. Furthermore, refreshes during this period should occur in a burst mode in which the entire DRAM array is refreshed in rapid sequence rather than in a distributed mode in which portions of the DRAM array are continuously being refreshed. By using a burst refresh mode, a considerable time will exist between refreshes, during which the cell plate voltage can be reduced from $V_{CC}$ to $V_{CC}-\Delta V$, thereby saving considerable power even with the expenditure of power incurred in reducing the cell plate voltage.

Figure 5:
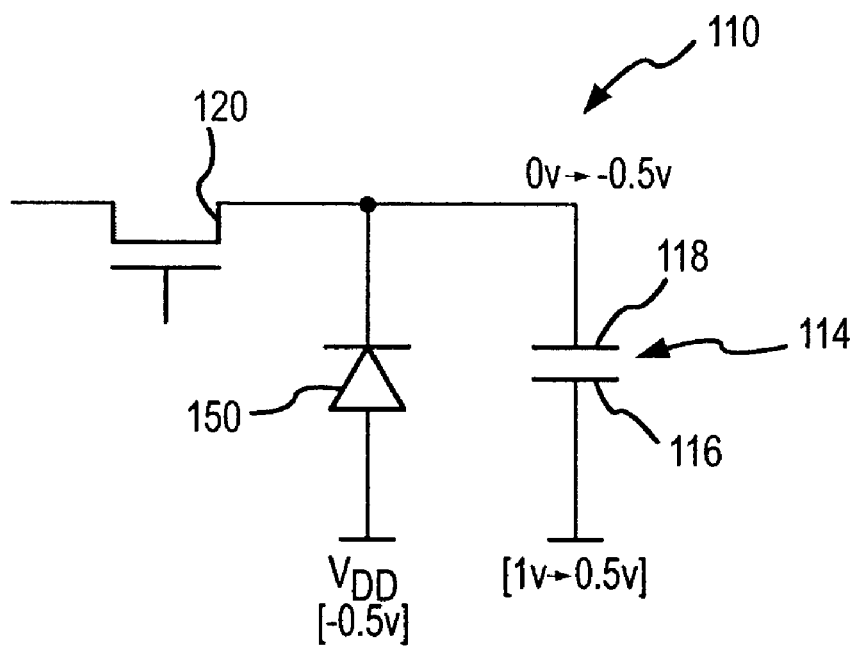
FIG. 5 is a schematic diagram showing memory cell of FIG. 3 in which the memory cell capacitor has been charged to 0V.

The required refresh rate could be reduced even further by reducing the cell plate voltage even further, the reasons for not doing so will be explained using the example shown in FIG. 5 in which the memory cell capacitor 114 has been initially charged to 0 V. Therefore, when the voltage on the cell plate 116 is reduced from 1V. to 0.5V, the voltage on the other plate 118 of the memory cell capacitor 114 is reduced to –0.5V. The voltage across the diode junction 150 is therefore reduced from 0.5V to 0V. However, if the voltage of the cell plate 116 was reduced to a greater extent, the voltage on the plate 118 of the memory cell capacitor 114 would become even more negative, and might forward-bias the diode junction 150. It is the diode junction 150 became forward-biased, the current leakage would be extraordinarily higher. Forward biasing the diode junction 150 could be prevented by making the substrate voltage VDD even more negative, but doing so would consume substantial power, might interfere with the operation of other portions of the DRAM device, and, by increasing the voltage differential between the store voltage in the substrate as well as other differentials, might increase charge leakage in other respects. The need to prevent the diode junction 150 from becoming forward-biased therefore limits the extent to which the cell plate voltage can be reduced in a static refresh mode.

Figure 6:
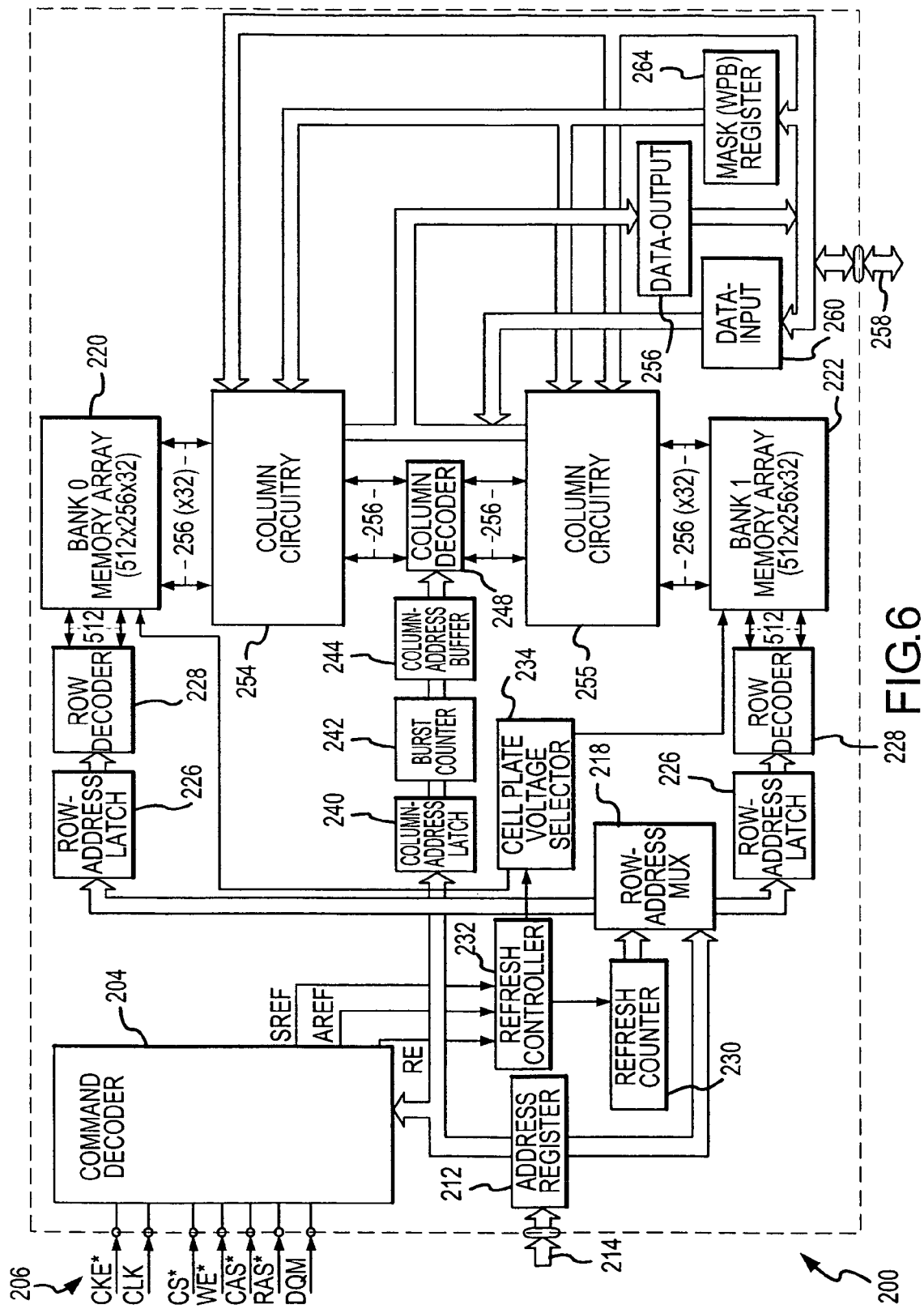
FIG. 6 is a block diagram of a DRAM device according to one embodiment of the invention.

A synchronous DRAM ("SDRAM") device 200 according to one embodiment of the invention in the shown in FIG. 6. The SDRAM 200 includes a command decoder 204 that controls the operation of the SDRAM 200 responsive to high-level command signals received on a control bus 206. These high level command signals, which are typically generated by a memory controller (not shown in FIG. 6), are a clock enable signal CKE*, a clock signal CLK, a chip select signal CS*, a write enable signal WE*, a row address strobe signal RAS*, a column address strobe signal CAS*, and a data mask signal DQM, in which the "*" designates the signal as active low. The command decoder 204 generates a sequence of command signals responsive to the high level command signals to carry out the function (e.g., a read or a write) designated by each of the high level command signals. For example, the command decoder 204 can receive and decode a command to cause the SDRAM to enter a self-refresh mode when the SDRAM is expected to not be active for a period. These command signals, and the manner in which they accomplish their respective functions, are conventional. Therefore, in the interest of brevity, a further explanation of these command signals will be omitted.

The SDRAM 200 includes an address register 212 that receives row addresses and column addresses through an address bus 214. The address bus 214 is generally applied to a memory controller (not shown in FIG. 6). A row address is generally first received by the address register 212 and applied to a row address multiplexer 218. The row address multiplexer 218 couples the row address to a number of components associated with either of two memory banks 220, 222 depending upon the state of a bank address bit forming part of the row address. Associated with each of the memory banks 220, 222 is a respective row address latch 226, which stores the row address, and a row decoder 228, which decodes the row address and applies corresponding signals to one of the arrays 220 or 222. The row address multiplexer 218 also couples row addresses to the row address latches 226 for the purpose of refreshing the memory cells in the arrays 220, 222. The row addresses are generated for refresh purposes by a refresh counter 230, which is controlled by a refresh controller 232. The refresh controller 232 is, in turn, controlled by the command decoder 204.

In accordance with one embodiment of the present invention, the refresh controller 232 is coupled to a cell plate voltage selector 234. More specifically, the cell plate voltage selector 234 receives complimentary control signals C, C* that cause the circuit selector to apply either a normal bias voltage $V_N$ or a static refresh bias voltage $V_R$ to the cell plates in the respective memory banks 220, 222. In the embodiment illustrated in FIG. 6, the normal bias voltage $V_N$ is 1V, and the static refresh bias voltage $V_R$ is 0.5V.

In operation, when entering a static refresh mode, such as a self-refresh mode, the refresh controller 232 applies control signals C, C* to the cell plate voltage selector 234 that cause it to discontinue coupling the voltage $V_N$ to the cell plates in the memory banks 220, 222 and instead couple the voltage $V_R$ to the cell plates. Prior to initiating a refresh of any of the rows of memory cells in the banks 220, 222, the refresh controller 232 applies control signals C, C* to the cell plate voltage selector 234 to cause it to coupling the normal bias voltage $V_N$ to the cell plates. The refresh controller 232 then initiates a burst refresh of all of the memory cells in the memory banks 220, 222. The refresh controller 232 then causes the cell plate voltage selector 234 to again couple the static refresh bias voltage $V_R$ to the cell plates in the memory banks 220, 222. When exiting a static refresh mode, such as the self-refresh mode, the refresh controller 232 applies control signals C, C* to the cell plate voltage selector 234 that causes it to apply the normal bias voltage $V_N$ to the cell plates of the memory banks 220, 222.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242 which applies a sequence of column addresses to the column address buffer 244 starting at the column address output by the address register 212. In either case, the column address buffer 244 applies a column address to a column decoder 248.

Data to be read from one of the arrays 220, 222 is coupled to the column circuitry 254, 255 for one of the arrays 220, 222, respectively. The data is then coupled through a data output register 256 to a data bus 258.

Data to be written to one of the arrays 220, 222 are coupled from the data bus 258 to a data input register 260. The write data are coupled to the column circuitry 254, 255 where they are transferred to one of the arrays 220, 222, respectively. A mask register 264 responds to a data mask DM signal to selectively alter the flow of data into and out of the column circuitry 254, 255, such as by selectively masking data to be read from the arrays 220, 222.

Figure 7:
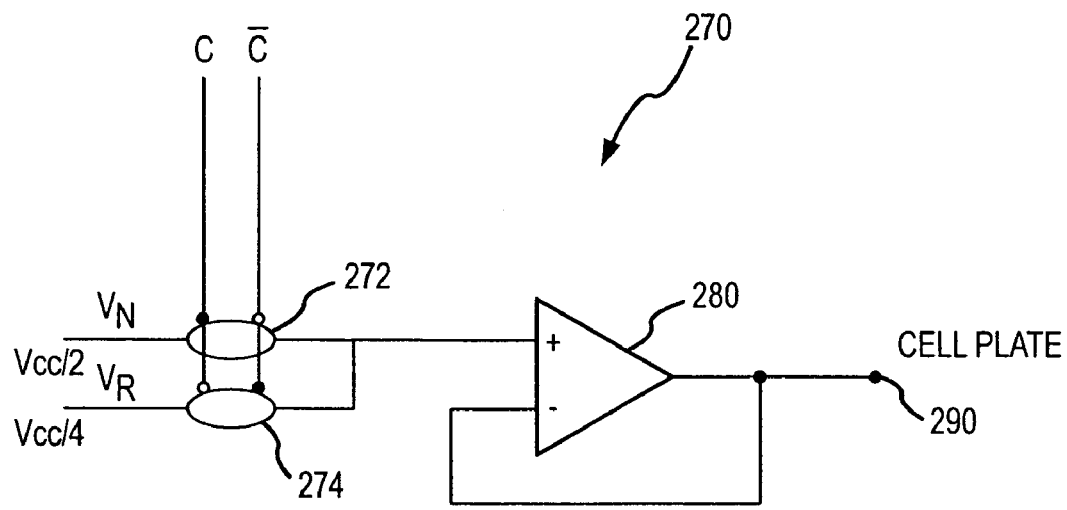
FIG. 7 is a block diagram showing a cell plate voltage selector used in the DRAM device of FIG. 6.

One embodiment of a cell plate voltage selector 270 that can be used as the cell plate voltage selector circuit 234 in the SDRAM 200 of FIG. 6 is shown in FIG. 7. The cell plate voltage selector 270 includes a pair of pass gates 272, 275 that are controlled by the control signals C, C* in a manner that causes the pass gates to be alternately enabled. The pass gate 272 is coupled to receive a normal voltage $V_N$ of $V_{CC}/2$ while the pass gate 274 is coupled to receive a static refresh bias voltage $V_R$ of $V_{CC}/4$. In the embodiment shown in FIG. 7, Vcc is equal to 2 volts, so $V_{CC}/2$ is equal to 1V, and $V_{CC}/4$ is equal to 0.5V. However, other voltages can be used. In either case, these voltages are provided by conventional means.

The pass gates 272, 274 alternately couple either $V_{CC}/2$ or $V_{CC}/4$ to a differential amplifier 280 configured to operate as a voltage follower. The output of the amplifier 280 is coupled to a cell plate 290. As is well-known in the art, the amplifier 280 configured as a voltage follower applies a voltage to its output that is equal to the voltage applied to its non-inverting input ("+"). The amplifier 280 has sufficient current drive to quickly drive the cell plate 290 to either $V_{CC}/2$ or $V_{CC}/4$, depending on what pass gate 272, 274 is conductive.

Figure 8:
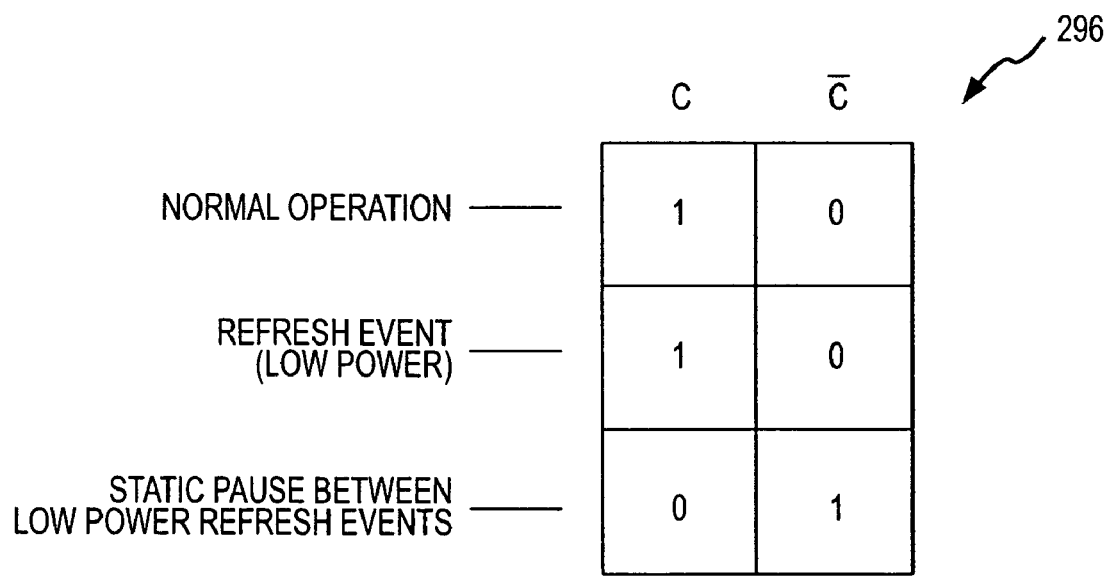
FIG. 8 is a truth table showing the operation of the cell plate voltage selector of FIG. 7.

The operation of the cell plate voltage selector 270 is summarized by the truth table 296 shown in FIG. 8. During normal operation of the SDRAM 200 or when memory cells are to be refreshed in a burst manner during the static refresh mode, the refresh controller 232 (FIG. 6) outputs control signals C,C* of "1,0" to make the pass gate 272 conductive and to make the pass gate 274 non-conductive. The differential amplifier 280 then receives and applies to the cell plate 290 the normal bias voltage $V_N$ of $V_{CC}/2$. During the period between refreshes in the static refresh mode, the refresh controller 232 outputs control signals C,C* of "0,1" to make the pass gate 272 non-conductive and the pass gate 274 conductive. The differential amplifier 280 then receives and applies to the cell plate 290 the static refresh bias voltage $V_R$ of $V_{CC}/4$.

Figure 9:
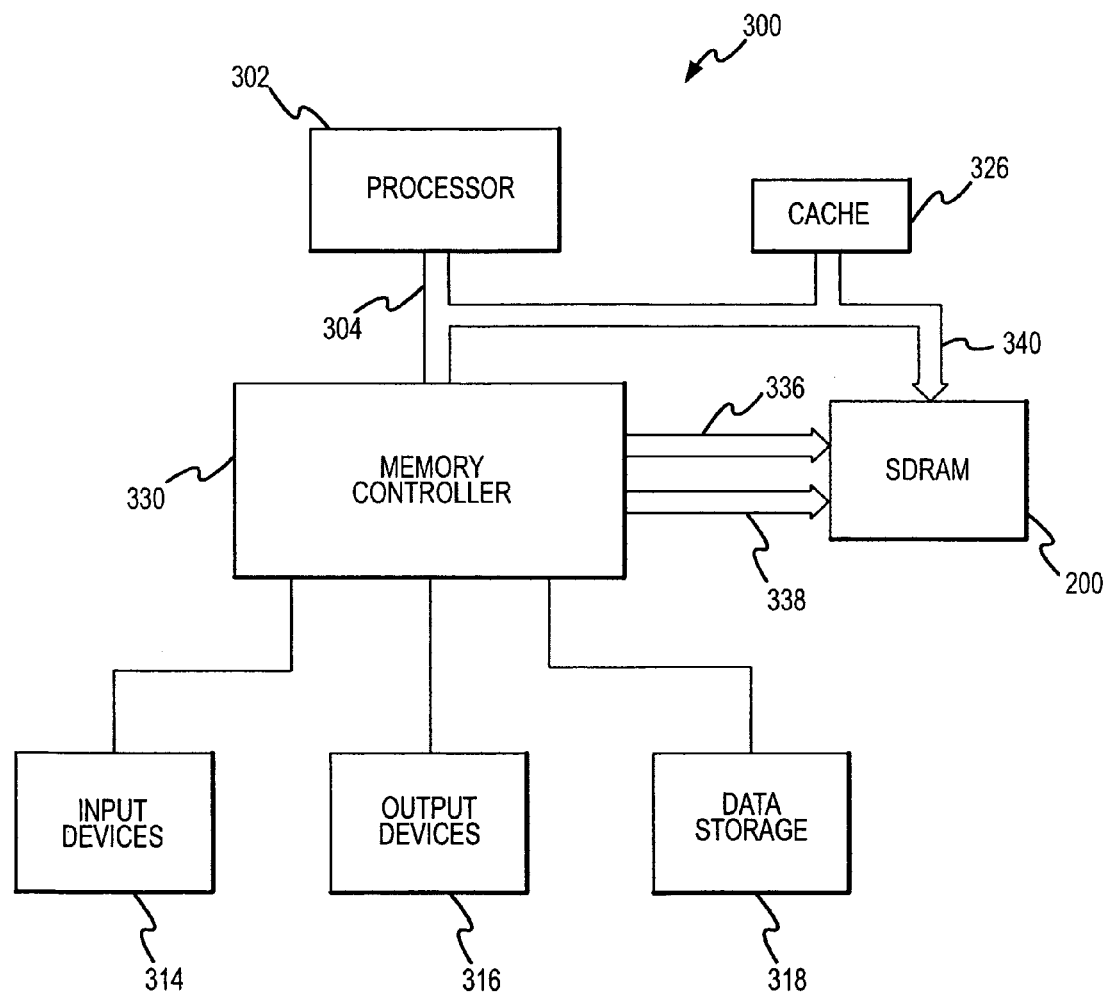
FIG. 9 is a block diagram of a processor-based system using the DRAM device of FIG. 6.

The SDRAM 200 shown in FIG. 6 can be used in various electronic systems. For example, it may be used in a processor-based system, such as a computer system 300 shown in FIG. 9. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor 302 to store data in or retrieve data from internal or external storage media (not shown). Examples of typical storage devices 318 include hard and floppy disks, tape cassettes, and compact disk read-only memories (CD-ROMs). The processor 302 is also typically coupled to cache memory 326, which is usually static random access memory ("SRAM"), and to the SDRAM 200 through a memory controller 330. The memory controller 330 normally includes a control bus 336 and an address bus 338 that are coupled to the SDRAM 200. A data bus 340 is coupled from the SDRAM 200 to the processor bus 304 either directly (as shown), through the memory controller 330, or by some other means.

Although the present invention has been described with reference to the disclosed embodiments, persons skilled in the art will recognize that changes may be made in form and detail without departing from the spirit and scope of the invention. Such modifications are well within the skill of those ordinarily skilled in the art. For example, although the operation of the cell plate selector 270 has been primarily discussed in the context of use in a self-refresh mode, it will be understood that it may also be used in other static refresh modes. Also, although specific cell plate voltages and voltage ratios has been discussed herein, it will be understood that other voltages and voltage ratios may be used. Accordingly, the invention is not limited except as by the appended claims.

We claim:

1. A method of operating a dynamic random access memory device having an array of memory cells that require periodic refresh, each of the memory cells including a memory cell capacitor formed by a cell plate that is common to the capacitors of a plurality of memory cells, the method comprising:
   in a normal operating mode, biasing the cell plate to a first voltage;
   in a static refresh mode, biasing the cell plate to a second voltage that is different from the first voltage except when memory cells in the array are to be refreshed; and
   in the static refresh mode, biasing the cell plate to the first voltage when memory cells in the array are to be refreshed.

2. The method of claim 1 wherein the static refresh mode comprises a self-refresh mode.

3. The method of claim 1, further comprising refreshing the memory cells in the array in a burst when memory cells in the array are to be refreshed in the static refresh mode.

4. The method of claim 1 wherein the first voltage is substantially equal to one-half a supply voltage for the dynamic random access memory device, and the second voltage is less than one-half a supply voltage for the dynamic random access memory device.

5. The method of claim 1, further comprising refreshing the memory cells in the array in the normal operating mode.

6. A method of operating a dynamic random access memory device having an array of memory cells that require periodic refresh, each of the memory cells including a memory cell capacitor formed by a cell plate that is common to the capacitors of a plurality of memory cells, the method comprising:
   in a normal operating mode, biasing the cell plate to a first voltage;
   in a static refresh mode, periodically refreshing the memory cells in the array during a refresh period;
   in the static refresh mode, biasing the cell plate to the first voltage during the refresh period;
   in the static refresh mode, biasing the cell plate to a second voltage during periods outside the refresh period, the second voltage being different from the first voltage; and
   after switching the memory device from operation in the static refresh mode to operation in the normal mode, biasing the cell plate to the first voltage.

7. The method of claim 6 wherein the static refresh mode comprises a self-refresh mode.

8. The method of claim 6 wherein the first voltage is substantially equal to one-half a supply voltage for the dynamic random access memory device, and the second voltage is less than one-half a supply voltage for the dynamic random access memory device.

9. The method of claim 6, further comprising refreshing the memory cells in the array in a burst when memory cells in the array are to be refreshed in the static refresh mode.

10. A method of operating a memory device having an array of memory cells that require periodic refresh, the method comprising:
   in a normal operating mode, biasing the memory cells to a first voltage;
   in a static refresh mode, periodically refreshing the memory cells in the array during a refresh period;
   in the static refresh mode, biasing the memory cells to the first voltage during the refresh period;
   in the static refresh mode, biasing the memory cells to a second voltage during periods outside the refresh period, the second voltage being different from the first voltage; and
   after switching the memory device from operation in the static refresh mode to operation in the normal mode, biasing the memory cells to the first voltage.

11. The method of claim 10 wherein the static refresh mode comprises a self-refresh mode.

12. The method of claim 10 wherein the first voltage is substantially equal to one-half a supply voltage for the memory device, and the second voltage is less than one-half a supply voltage for the memory device.

13. The method of claim 10, further comprising refreshing the memory cells in the array in a burst when memory cells in the array are to be refreshed in the static refresh mode.

* * * * *

UNITED STATES PATENT AND TRADEMARK OFFICE
CERTIFICATE OF CORRECTION

| | | |
|---|---|---|
| PATENT NO. | : 7,408,828 B1 | Page 1 of 1 |
| APPLICATION NO. | : 11/430379 | |
| DATED | : August 5, 2008 | |
| INVENTOR(S) | : Casper | |

It is certified that error appears in the above-identified patent and that said Letters Patent is hereby corrected as shown below:

On the title page, in field (57), under "Abstract", in column 2, line 9, before "across" delete "reduces the voltage".

In column 1, line 10, after "of" delete "pending".

In column 1, line 11, delete "2004." and insert -- 2004, now U.S. Pat. No. 7,082,073. --, therefor.

Signed and Sealed this

Twenty-first Day of October, 2008

JON W. DUDAS
*Director of the United States Patent and Trademark Office*